US009153772B2

(12) United States Patent
Franke

(10) Patent No.: US 9,153,772 B2
(45) Date of Patent: Oct. 6, 2015

(54) DEVICE FOR INCREASING THE MAGNETIC FLUX DENSITY

(75) Inventor: Joerg Franke, Freiburg (DE)

(73) Assignee: Micronas GmbH, Freiburg (DE)

( * ) Notice: Subject to any disclaimer, the term of this patent is extended or adjusted under 35 U.S.C. 154(b) by 370 days.

(21) Appl. No.: 13/407,581

(22) Filed: Feb. 28, 2012

(65) Prior Publication Data

US 2012/0217597 A1 Aug. 30, 2012

Related U.S. Application Data

(60) Provisional application No. 61/449,975, filed on Mar. 7, 2011.

(30) Foreign Application Priority Data

Feb. 28, 2011 (DE) .......................... 10 2011 012 639

(51) Int. Cl.
*H01L 29/82* (2006.01)
*H01L 43/04* (2006.01)
*H01L 43/08* (2006.01)
*H01L 27/22* (2006.01)

(52) U.S. Cl.
CPC ................ *H01L 43/04* (2013.01); *H01L 27/22* (2013.01); *H01L 43/08* (2013.01)

(58) Field of Classification Search
CPC ............................... H01L 27/22; H01L 43/08
USPC ................................................. 257/421, 422
See application file for complete search history.

(56) References Cited

U.S. PATENT DOCUMENTS

| 4,901,571 A | 2/1990 | Reinhardt et al. |
| 8,453,505 B2 * | 6/2013 | Erdler et al. ............... 73/514.09 |
| 2010/0194386 A1 * | 8/2010 | Prins et al. .................... 324/228 |
| 2010/0295140 A1 * | 11/2010 | Theuss et al. ................. 257/421 |

FOREIGN PATENT DOCUMENTS

| DE | 38 04 220 A1 | 8/1989 |
| DE | 10 2006 007 900 A1 | 9/2007 |
| EP | 2 322 906 A1 | 5/2011 |
| JP | 63-153472 | 6/1988 |

OTHER PUBLICATIONS

Popovic et al., "Hall ASICs with Integrated Magnetic Concentrators," Proceedings Sensor Expo & Conference, Boston, MA, p. 1-12 (Sep. 23-26, 2002).
Schott et al., "Smart CMOS Sensors with Integrated Magnetic Concentrators," Sensors, IEEE, p. 959-962 (2005).

* cited by examiner

*Primary Examiner* — Howard Weiss
*Assistant Examiner* — Tifney Skyles
(74) *Attorney, Agent, or Firm* — Muncy, Geissler, Olds & Lowe, P.C.

(57) ABSTRACT

A device for increasing the magnetic flux density includes a semiconductor body and a first magnetic sensor integrated into the semiconductor body, whereby a housing section, which forms a cavity, is arranged above the sensor on the semiconductor surface and the cavity is filled with a ferromagnetic material and the material comprises a liquid.

18 Claims, 1 Drawing Sheet

DEVICE FOR INCREASING THE MAGNETIC FLUX DENSITY

This nonprovisional application claims priority under 35 U.S.C. §119(a) to German Patent Application No. DE 10 2011 012 639.2, which was filed in Germany on Feb. 28, 2011, and to U.S. Provisional Application No. 61/449,975, which was filed on Mar. 7, 2011, and which are both herein incorporated by reference.

BACKGROUND OF THE INVENTION

1. Field of the Invention

The present invention relates to a device for increasing a magnetic flux density.

2. Description of the Background Art

A semiconductor body with an integrated magnetic sensor, whose sensitivity is increased by means of a ferromagnetic layer which lies on the semiconductor surface and conducts the magnetic flux through the sensor is known from the publication, R. S. Popovic, C. Schott, "Hall ASICs with integrated magnetic concentrators", Proceedings SENSORS EXPO & CONFERENCE, Boston, Mass., USA, Sep. 23-26, 2002.

Another device is known from the publication, C. Schott, R. Racz, S. Huber, "Smart CMOS Sensors with Integrated Magnetic Concentrators"; Sensors, 2005 IEEE, pp. 959-962. In this case, the magnetic field is concentrated by means of the overlying ring-shaped ferromagnetic layer and the direction of the outer magnetic field is determined by an evaluation circuit.

SUMMARY OF THE INVENTION

It is therefore an object of the invention to provide a device that increases a magnetic flux density.

According to an embodiment of the invention, a device for increasing the magnetic flux density is provided, comprising a semiconductor body and a first magnetic sensor integrated into the semiconductor body, whereby a housing section is arranged above the sensor on the semiconductor surface of the semiconductor body, whereby the housing section forms a cavity, and the cavity is surrounded on all sides and filled completely with a ferromagnetic material and the material comprises a liquid.

An advantage of the device of the invention is that the formation of a cavity, which is formed preferably directly above the semiconductor surface of the sensor, can be carried out by means of a masking step in a semiconductor production line, without a ferromagnetic layer being processed in the production line. A drop in output in semiconductor production because of contamination with ferromagnetic materials caused by the production of the ferromagnetic layer can be ruled out. In this way, the formation of the housing section for cavity formation can be easily integrated into a standard CMOS production line. Tests by the applicant have shown that it is advantageous to form the cavity at the wafer level plane by a photolithographic process and to fill the cavity preferably outside the production line at least partially, preferably completely, by means of a ferromagnetic material. An advantage of the complete filling with the ferromagnetic material is that with a change in position or in the case of action of acceleration forces the ferromagnetic material or the ferromagnetic liquid does not change the particular location of the center of gravity within the cavity, which completely surrounds the material.

To achieve a most cost-effective and reliable formation of the cavity, it is preferable to make the housing section at least partially, preferably completely of plastic. Lacquers, such as, for example, SU8 lacquer, can be used in particular for the formation at least of parts of the housing section. According to an embodiment, the semiconductor surface forms the bottom of the housing section or the bottom of the cavity. In an alternative embodiment, the bottom is also formed by a plastic layer, whereby the bottom is produced preferably before the formation of the housing sections which are perpendicular to the semiconductor surface. Further, it is preferable to enclose the cavity on all sides. To this end, a cover is formed on the cavity after the introduction of the ferromagnetic material. Preferably, the housing section part rising from the semiconductor surface has a substantially cylindrical form. In this case, the diameter is less than 3 mm, preferably less than 1 mm. The height of the cylinder is preferably less than 1 mm, preferably less than 400 µm. The diameter of the cylinder wall is less than 100 µm, preferably less than 30 µm.

In an embodiment, the cavity takes up at least partially a ferromagnetic liquid. Preferably, ferromagnetic liquids that have a high permeability are used. According to a preferred embodiment, the material in the cavity comprises a ferromagnetic body whose outer form is shaped, for example, as a sphere. It goes without saying that the ferromagnetic body preferably has a high permeability. Compounds are used in particular for this purpose, which in addition to the high permeability have a high remanence and belong to the group of hard ferrites, such as, for example, AlNiCo, SmCo, or NdFeB. Such bodies are also called permanent magnets. Tests by the applicant have shown that it is advantageous to place spherical hard ferrites movably within the cavity, preferably in a liquid, which has a density comparable to the hard ferrites. In other words, it is preferable that the ferromagnetic body floats in the liquid and aligns itself in a magnetic field, acting on the cavity from the outside. If the body, such as the hard ferrites, already has a magnetization, an integrated compass can be formed by the device of the invention. It is noted that in another refinement the liquid in which the ferromagnetic body is placed rotatable also has ferromagnetic properties. After the formation of the integrated compass or the device in general, the semiconductor body can be diced, which is then also called a die, and made into a so-called chip by means of a bonding process and a molding process.

The magnetic field acting from outside on the cavity can be concentrated by means of the ferromagnetic material in the cavity; i.e., the magnetic flux density is increased by the sensor formed below the cavity. If a hard ferrite is movably placed in the cavity as an integrated compass, an alignment of the compass is achieved even by a weak outer magnetic field and causes a great change in the magnetic flux in the magnetic sensor lying below. As a result, a highly sensitive arrangement can be formed to detect reliably the magnetic fields on the order of the Earth's magnetic field.

According to an embodiment, the magnetic sensor can be formed as a Hall sensor. Preferably, the first sensor is formed as a single sensor. In another embodiment, the first sensor comprises a plurality of single sensors to detect different components of the magnetic field. In this case, it is preferable to form the first sensor substantially in the center below the middle of the housing section or cavity. In an alternative embodiment, a plurality of sensors is formed below the cavity, whereby at least part of the sensors are arranged orthogonally to one another with respect to the detection of the magnetic flux. To this end, the normal vectors of the sensor surfaces are orthogonal to one another. A two-dimensional and/or a three-dimensional detection of the magnetic flux can be carried readily by means of the orthogonal arrangement of sensors. In another refinement, for a differential detection of the magnetic flux, a plurality of sensors arranged in pairs is formed below the cavity. For this purpose, in each case, always two pairs of sensors arranged parallel to one another are arranged at a distance from one another.

It is preferred, furthermore, to integrate an electronic circuit, which evaluates the signals of the magnetic sensor or magnetic sensors, in the semiconductor surface.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
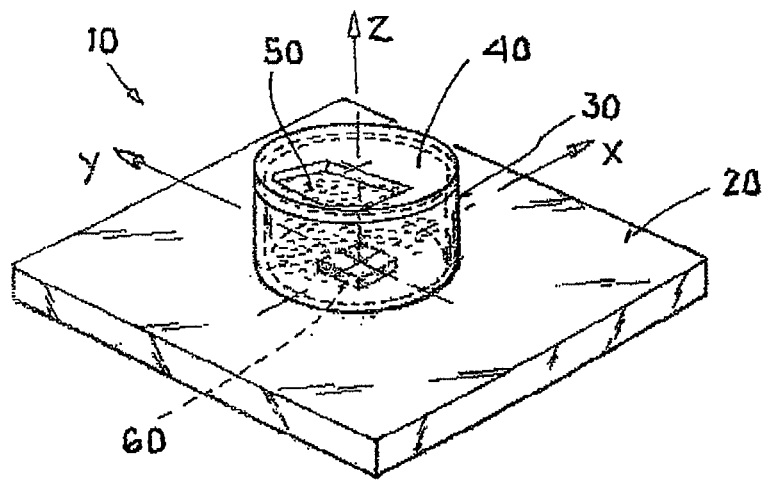
FIG. 1 shows a schematic view of a first embodiment of a housing section with a sensor lying below.

The illustration in FIG. 1 shows an embodiment of a device 10 of the invention for increasing the magnetic flux density, having a semiconductor body 20, a cylindrical housing section 30 formed on the surface of semiconductor body 20, and the one cavity 40, which is filled at least partially, preferably completely, with a ferromagnetic material 50, preferably a ferromagnetic liquid. The bottom of cavity 40 is formed from the semiconductor surface. A first magnetic sensor 60 is formed below cavity 40 in semiconductor body 20. It is noted that the first sensor 60 is in fact formed in the center below cavity 40, but other positions for a sensor outside the center or below the cavity are advantageous. In semiconductor body 20, the first sensor 60, which is made preferably as a Hall sensor, especially as a Hall plate, is connected to an electronic circuit, which is not shown.

The first sensor 60 can be set up as a vertical sensor for measuring the x and/or the y component of the magnetic field.

Figure 2:
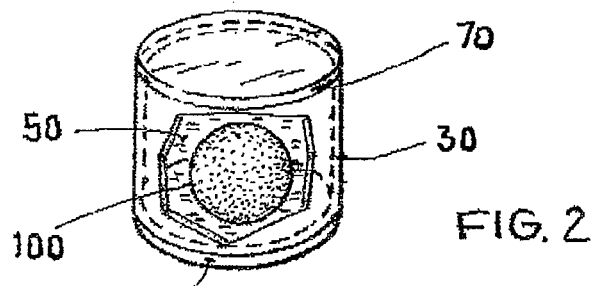
FIG. 2 shows a schematic view of a cavity, enclosed on all sides, with an interior ferromagnetic sphere.

Another embodiment is shown in the illustration of FIG. 2. Housing section 30 has a cover 70 and a bottom 80. In this way, cavity 40 is enclosed on all sides. Housing section 30, cover 70, and bottom 80 are made of plastic, whereby at least housing section 30 is made of an SU8 lacquer. Escape of the liquid is prevented by the arrangement of cover 70. Cavity 40 comprises a liquid and a ferromagnetic sphere 100, which is arranged in the liquid and is formed preferably as a hard ferrite. The liquid has a comparable density as the density of sphere 100. In this way, floating of sphere 100 is achieved and sphere 100, which itself has a north pole and a south pole, aligns itself along the externally applied magnetic field lines. As a result, an integrated compass is formed.

Figure 3:
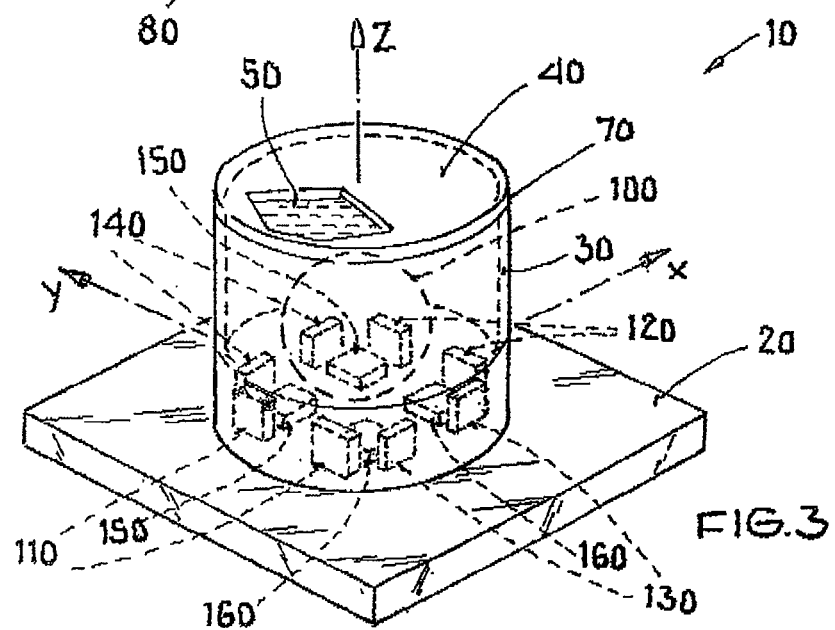
FIG. 3 shows a schematic view of an embodiment with a plurality of sensors arranged below the cavity.

In the embodiment of FIG. 3, a device of the invention is shown, which is formed as an integrated magnetic compass. A plurality of magnetic sensors, combined into individual pairs, is arranged below cavity 40. The sensor pairs are integrated into semiconductor body 20, but for a better view they are shown as formed on the surface of semiconductor body 20. Because the surfaces of pairs are arranged orthogonally to another, the magnetic flux can also be detected differentially in all three spatial directions. For an x-spatial direction, to detect the flux, a sensor pair 110 and a sensor pair 120 at a distance therefrom are provided. For a y-spatial direction, to detect the flux, a sensor pair 130 and a sensor pair 140 at a distance therefrom are provided. For a z-spatial direction, to detect the flux, a sensor pair 150 and a sensor pair 160 at a distance therefrom are provided.

It is noted that in an embodiment, which is not shown, at least two individual, preferably vertically arranged sensors are formed below the cavity. As a result, particularly the x-component and the y-component of the magnetic field can be determined advantageously. Furthermore, it is also sufficient, provided that a differential determination is not to be carried out, to arrange precisely one sensor for each spatial direction.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A device for increasing a magnetic flux density, the device comprising:
a semiconductor body;
a first magnetic sensor integrated into the semiconductor body; and
a housing section arranged above the first magnetic sensor on a semiconductor surface of the semiconductor body, the housing section forming a cavity that is surrounded on all sides and filled completely with a ferromagnetic material, the ferromagnetic material comprising a liquid,
wherein the housing section is arranged completely on and above the semiconductor surface, and wherein a floor of the cavity is formed by the semiconductor surface.

2. A device for increasing a magnetic flux density, the device comprising:
a semiconductor body;
a first magnetic sensor integrated into the semiconductor body; and
a housing section arranged above the first magnetic sensor on a semiconductor surface of the semiconductor body, the housing section forming a cavity that is surrounded on all sides and filled completely with a ferromagnetic material,
wherein the material comprises a ferromagnetic sphere.

3. The device according to claim 1, wherein the housing section is made of a plastic.

4. The device according to claim 1, wherein the semiconductor surface of the semiconductor body forms a bottom of the housing section.

5. The device according to claim 1, wherein the housing section has a substantially cylindrical form.

6. The device according to claim 1, wherein the housing section is formed at least partially of a lacquer used in a semiconductor masking process.

7. The device according to claim 1, wherein the first magnetic sensor is formed as a Hall sensor.

8. The device according to claim 1, wherein the first magnetic sensor is formed substantially in a center of the housing section.

9. The device according to claim 1, wherein, for a differential detection of the magnetic flux, a plurality of sensors arranged in pairs is formed below the cavity.

10. The device according to claim 1, wherein, for a differential detection of the magnetic flux, a plurality of sensors, whose surface forms a normal vector orthogonal to one another, is provided below the cavity.

11. The device according to claim 1, wherein an electronic circuit, which evaluates the signals of the magnetic sensor, is integrated into the semiconductor body.

12. The device according to claim 1, wherein the cavity is entirely sealed by the housing.

13. A device for increasing a magnetic flux density, the device comprising:
   a semiconductor body;
   a first magnetic sensor integrated into the semiconductor body; and
   a housing section arranged above the first magnetic sensor on a semiconductor surface of the semiconductor body, the housing section forming a cavity that is surrounded on all sides and filled completely with a ferromagnetic material, the ferromagnetic material comprising a liquid and a ferromagnetic sphere disposed within the liquid.

14. A device for increasing a magnetic flux density, the device comprising:
   a semiconductor body;
   a first magnetic sensor integrated into the semiconductor body; and
   a housing section arranged above the first magnetic sensor on a semiconductor surface of the semiconductor body, the housing section forming a cavity that is surrounded on all sides and filled completely with a ferromagnetic material, the ferromagnetic material comprising a liquid and a single ferromagnetic sphere disposed within the liquid.

15. The device according to claim 1, wherein the ferromagnetic material comprises a single ferromagnetic sphere disposed within the ferromagnetic liquid.

16. The device according to claim 1, wherein the housing comprises a cover disposed over the housing.

17. The device according to claim 1, wherein the cavity is disposed directly above the first magnetic sensor.

18. The device according to claim 1, wherein the ferromagnetic material is disposed entirely above the first magnetic sensor.

* * * * *